(12) United States Patent
Wang et al.

(10) Patent No.: US 11,545,646 B2
(45) Date of Patent: Jan. 3, 2023

(54) METAL MASK HAVING GROOVE WITHIN PERIPHERAL REGION THEREOF, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Shilong Wang, Beijing (CN); Zhiliang Jiang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 16/989,389

(22) Filed: Aug. 10, 2020

(65) Prior Publication Data

US 2021/0159454 A1 May 27, 2021

(30) Foreign Application Priority Data

Nov. 26, 2019 (CN) .......................... 201911172698.4

(51) Int. Cl.
*H01L 29/08* (2006.01)
*H01L 51/52* (2006.01)
(Continued)

(52) U.S. Cl.
CPC ...... *H01L 51/5253* (2013.01); *H01L 27/3244* (2013.01); *H01L 51/56* (2013.01)

(58) Field of Classification Search
CPC ...................................................... H01L 29/08
See application file for complete search history.

(56) References Cited

U.S. PATENT DOCUMENTS

2001/0019807 A1* 9/2001 Yamada .............. H01L 51/0011
427/272
2002/0076847 A1* 6/2002 Yamada ............... C23C 14/042
438/944
(Continued)

FOREIGN PATENT DOCUMENTS

CN 103911584 A 7/2014
CN 106119773 A 11/2016
(Continued)

OTHER PUBLICATIONS

"First Office Action and English language translation", CN Application No. 201911172698.4, dated Oct. 20, 2021, 18 pp.

*Primary Examiner* — Caleb E Henry
(74) *Attorney, Agent, or Firm* — Myers Bigel, P.A.

(57) ABSTRACT

A metal mask, a display panel and a display device are proposed. The metal mask comprises an opening region and a peripheral region surrounding the opening region. The peripheral region is provided with a first groove, the first groove may surround the opening region. By arranging a first groove surrounding the opening region in the peripheral region, sagging of the metal mask during the fabrication of the display panel can be decreased effectively, and tension of the metal mask can be reduced, which improves the thickness uniformity of an inorganic encapsulation layer formed by using the metal mask, thereby achieving a higher production yield of the display panel.

13 Claims, 4 Drawing Sheets

(51) Int. Cl.
*H01L 27/32* (2006.01)
*H01L 51/56* (2006.01)

(56) References Cited

U.S. PATENT DOCUMENTS

| | | | |
|---|---|---|---|
| 2016/0115580 A1* | 4/2016 | Mizumura | C23F 1/02 |
| | | | 118/720 |
| 2017/0084869 A1* | 3/2017 | Wang | H01L 51/5262 |
| 2018/0209028 A1* | 7/2018 | Li | C23C 14/24 |
| 2019/0136365 A1* | 5/2019 | Kawasaki | H05B 33/10 |
| 2019/0144986 A1 | 5/2019 | Bai | |
| 2019/0203338 A1* | 7/2019 | Kawasaki | H05B 33/10 |
| 2019/0211437 A1* | 7/2019 | Obata | C23C 16/44 |
| 2021/0147976 A1* | 5/2021 | Huang | G06F 1/189 |
| 2021/0164087 A1 | 6/2021 | Lin et al. | |

FOREIGN PATENT DOCUMENTS

| | | |
|---|---|---|
| CN | 106480404 A | 3/2017 |
| CN | 107675128 A | 2/2018 |
| CN | 108385083 A | 8/2018 |
| CN | 109023235 A | 12/2018 |
| CN | 109536886 A | 3/2019 |
| CN | 109913805 A | 6/2019 |
| JP | 2000096211 A | 4/2000 |
| JP | 5534093 B1 | 5/2014 |

\* cited by examiner

METAL MASK HAVING GROOVE WITHIN PERIPHERAL REGION THEREOF, DISPLAY PANEL AND DISPLAY DEVICE

CROSS REFERENCE TO RELATED APPLICATIONS

The present application claims the priority benefits of the patent application No. 201911172698.4 filed with the Patent Office of China on Nov. 26, 2019, the disclosure of which is incorporated herein by reference.

TECHNICAL FIELD

This disclosure relates to the technical field of display technologies, and specifically to a metal mask, a display panel and a display device.

BACKGROUND

A mask is a common component used during a process of fabricating a display product such as a display panel. For example, in the active matrix organic light-emitting diode (AMOLED) thin film packaging technology, a metal mask may be used to pattern an inorganic encapsulation layer for an AMOLED display panel. However, the existing mask still needs to be improved.

SUMMARY

A metal mask comprising an opening region and a peripheral region is provided, the opening region comprising a plurality of openings penetrating the metal mask, the peripheral region surrounding the opening region, the metal mask further comprises a first groove within the peripheral region.

According to some embodiments of the disclosure, the first groove comprises a first portion extending along a first edge in a first direction of the metal mask and a second portion extending along a second edge in a second direction of the metal mask. A distance from the first portion to the first edge in the second direction is greater than zero, a minimum distance from the second portion to the second edge in the first direction is zero, and the first direction intersects the second direction.

According to some embodiments of the disclosure, a width of the first portion of the first groove in the second direction is in a range of 6~30 mm.

According to some embodiments of the disclosure, a width of the second portion of the first groove in the first direction is in a range of 6~30 mm.

According to some embodiments of the disclosure, a depth of the first groove is 50%~60% of a thickness of the peripheral region.

According to some embodiments of the disclosure, a shape of a cross section of the first portion of the first groove in the second direction is selected from a group consisting of a square, an inverted trapezoid and a circle.

According to some embodiments of the disclosure, a shape of a cross section of the second portion of the first groove in the first direction is selected from a group consisting of a square, an inverted trapezoid and a circle.

According to some embodiments of the disclosure, the metal mask further comprises a second groove in the peripheral region, the second groove is between the first groove and the opening region.

According to some embodiments of the disclosure, the second groove extends along the first edge in the first direction of the metal mask, and the second groove and the first groove are separated from each other.

According to some embodiments of the disclosure, a depth of the second groove is greater than a depth of the first groove.

According to some embodiments of the disclosure, the plurality of openings within the opening region are arranged in an array, the metal mask further comprises a third groove located between two adjacent rows of openings, and the third groove extends in a same direction as the second groove.

According to some embodiments of the disclosure, a width of the third groove in the second direction is smaller than a width of each of the first groove and the second groove in the second direction.

According to some embodiments of the disclosure, a depth of the third groove is equal to the depth of the second groove.

A further embodiment of the disclosure provides a display panel, comprising: an inorganic encapsulation layer obtained by a deposition process using the metal mask according to any of the foregoing embodiments.

Yet another embodiment of the disclosure provides a display device, comprising the display panel according to the above embodiment.

Some additional aspects and advantages of this disclosure will be described in the following description, and others will be made obvious through the following description or learned through the practice of this disclosure.

BRIEF DESCRIPTION OF DRAWINGS

The features and advantages of the above embodiments of this disclosure will be explained with reference to the specific description of the embodiments by the drawings, wherein.

DETAILED DESCRIPTION OF EMBODIMENTS

The embodiments of this disclosure will be described in detail, and those skilled in the art will understand that the embodiments below are intended for explaining the disclosure, rather than limiting the application. Unless specified otherwise, where no specific techniques or conditions are specifically described in the following embodiments, those skilled in the art can implement the embodiments according to conventional techniques or conditions in the art or in light of the specification of the product.

In the description below, the following reference signs may be used:

| | | |
|---|---|---|
| 100 metal mask | 101 first groove | 102 second groove |
| 103 third groove | 104 opening | 110 frame |
| 200 substrate | 201 functional layers | |
| 202 first barrier | 203 second barrier | |
| 204 organic encapsulation layer | | |
| 205 first inorganic encapsulation layer | | |
| 206 second inorganic encapsulation layer | | |

Figure 1:
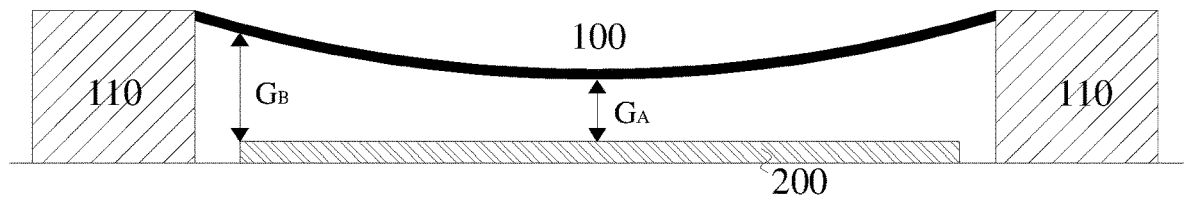
FIG. 1 illustrates sagging of a metal mask during the fabrication of a display panel.

The main structure of the mask mentioned in the embodiments herein comprises a patterned metal layer, and the patterned metal layer can be considered to be similar to a metal mesh or grid. FIG. 1 schematically shows a metal mask 100 placed on a frame 110, the metal mask is supported and fixed by the frame 110. A substrate 200 under the mask represents a product to be processed on which a pattern is to be formed by means of the mask 100. For example, the substrate 200 may actually be an unencapsulated OLED display panel, on which an inorganic material can be deposited to form a patterned inorganic encapsulation layer by means of the mask 100.

Figure 2:
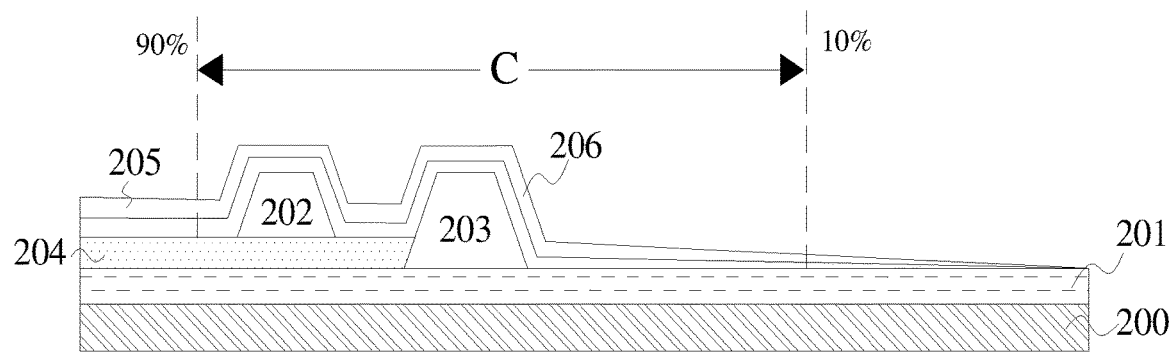
FIG. 2 illustrates the thickness gradation of a fabricated inorganic encapsulation layer caused by the sagging of the metal mask.

However, it is found by inventors of the application that in the actual fabrication process, the metal mask 100 supported by the frame 110 is apt to sag under gravity, which leads to a difference in gaps between a central area of the mask 100 and the substrate 200 and between an edge area of the mask close to the frame and the substrate 200. For example, a gap $G_A$ between the central area of the mask and the substrate shown in FIG. 1 is obviously smaller than a gap $G_B$ between the edge area of the mask and the substrate, which will result in nonuniformity of the film thickness of the pattern of the inorganic encapsulation layer at different positions on the surface of the substrate 200. FIG. 2 schematically shows the thickness change of a formed inorganic encapsulation layer. As shown in FIG. 2, both the first inorganic encapsulation layer 205 and the second inorganic encapsulation layer 206 have a uniform thicknesses. A region C illustrated in FIG. 2 indicates a region (which is referred to as a shadow herein) where a thickness of the encapsulation layer gradually changes from 10% to 90%. Moreover, with an increasing difference in the gaps described above, the area of the shadow C will become larger. Therefore, the inventors of the application realize that, in order to improve the thickness uniformity of the inorganic encapsulation layer of the display panel to enhance the yield of the display panel, it is necessary to reduce the difference in the gaps between different areas of the metal mask and the product to be processed, i.e., to mitigate the sagging of the metal mask supported by the frame.

Figure 3:
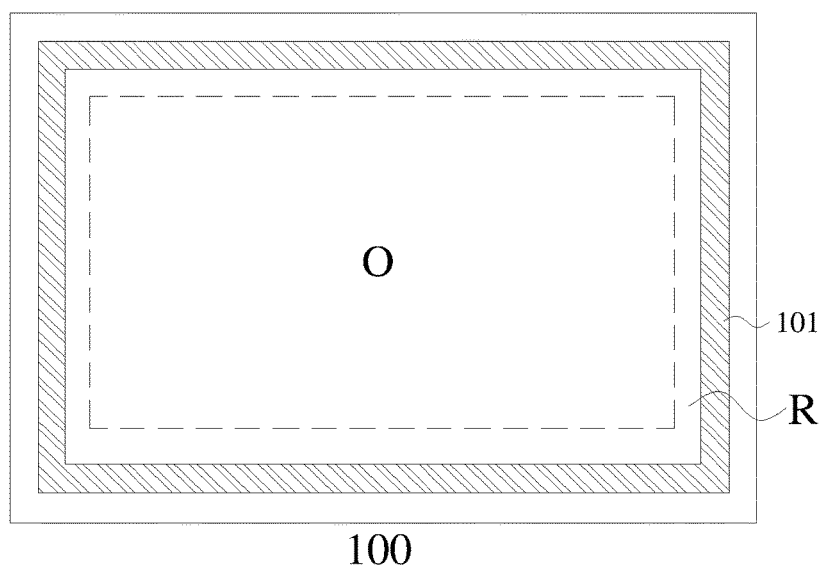
FIG. 3 is a schematic top view of the metal mask according to an embodiment of this disclosure.

FIG. 3 schematically shows a top view of the metal mask according to an embodiment of the disclosure, in other words, FIG. 3 illustrates a section view taken in parallel with a plane of the metal mask. In this embodiment, a groove is provided in a peripheral region of the metal mask, which can effectively decrease the sagging of the metal mask. As shown in FIG. 3, the metal mask 100 comprises an opening region O and a peripheral region R, the peripheral region R surrounding the opening region O. A first groove 101 is provided in the peripheral region R, and the first groove 101 surrounds the opening region O. The "groove" mentioned herein refers to a recess which is formed in some areas (e.g., the peripheral region or some regions in the middle) of the metal mask and does not penetrate the body of the metal mask. In other words, an area of the metal mask with the groove has a smaller thickness than an area without the groove. The groove can be formed by any suitable process, including but not limited to an etching process. In case the groove is formed by an etching process, since the groove does not penetrate the metal mask, the groove herein may also be called "a partially etched groove". The opening region O of the metal mask may comprise a plurality of independent openings, which are not shown in FIG. 3 for simplicity. As can be confirmed in the experiments described later, by arranging the first groove around the opening region O in the peripheral region R, the sagging of the metal mask 100 supported by the frame can be alleviated effectively, and surface tension of the metal mask can be reduced, which improves the quality of patterns formed on the product to be processed by means of the metal mask.

By experiments, it is found that the closer the first groove 101 is to the edge of the metal mask 100, the more obviously the sagging of the edge area is decreased. In some embodiments of this disclosure, with reference to FIG. 4, the first groove 101 comprises a first portion extending along a first edge in a first direction of the metal mask and a second portion extending along a second edge in a second direction of the metal mask, a distance in the second direction from the first portion to the first edge is greater than zero, and a minimum distance in the first direction from the second portion to the second edge is zero, and the first direction intersects the second direction. In some embodiments, an outer boundary of the first portion or second portion of the first groove coincides with the edge of the metal mask.

Figure 4:
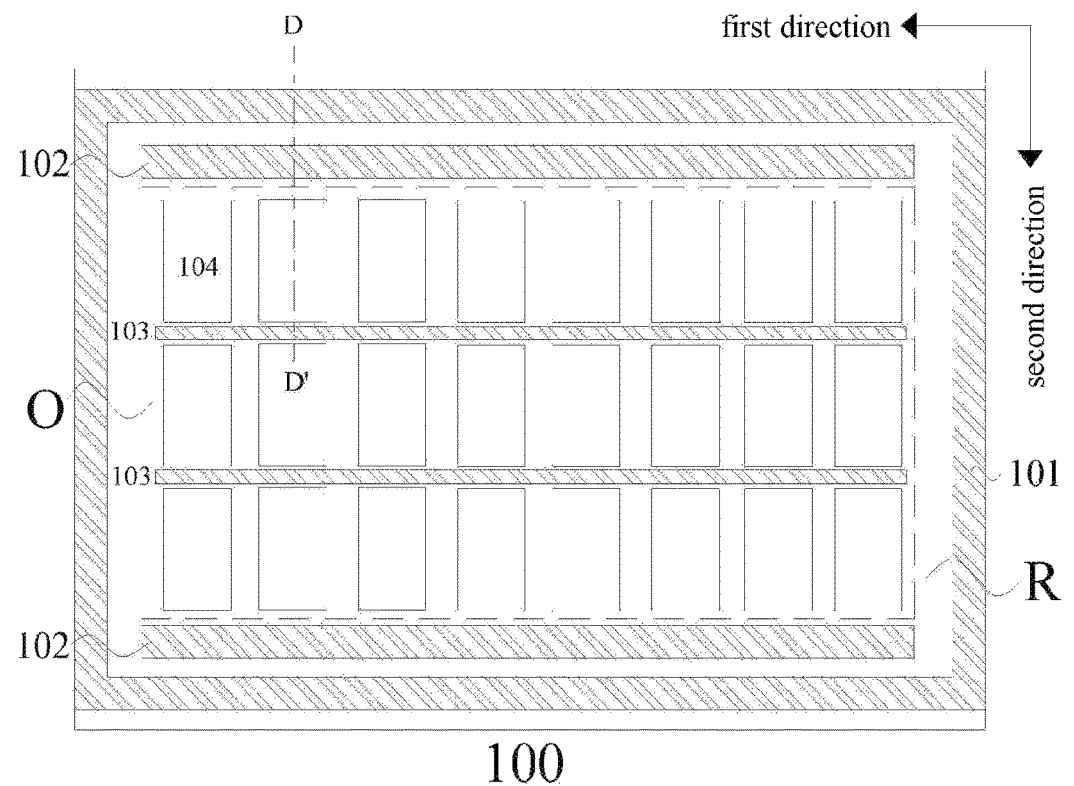
FIG. 4 is a schematic top view of the metal mask according to another embodiment of this disclosure.

According to another embodiment of this disclosure, with reference to FIG. 4, the peripheral region R may be further provided with a second groove 102, the second groove 102 is located between the first groove 101 and the opening region O and extends in the first direction. This can further decrease the sagging of the metal mask in the second direction and thus further improve the thickness uniformity of the inorganic encapsulation layer formed by using the metal mask.

According to an embodiment of the disclosure, with reference to FIG. 4, the opening region O may comprise a plurality of openings 104 arranged in an array, and the "opening" herein means not comprising an a material of the metal mask, i.e., the openings penetrate the body of the metal mask. In an embodiment, a third groove 103 may be further provided between any two adjacent rows of the openings 104 in the first direction, and the third groove 103 extends in the first direction. In this way, not only sagging of the metal mask in the second direction may be decreased, but also the weight of the central area of the metal mask is reduced, thereby further improving the sagging of the metal mask in the first direction.

Figure 5:
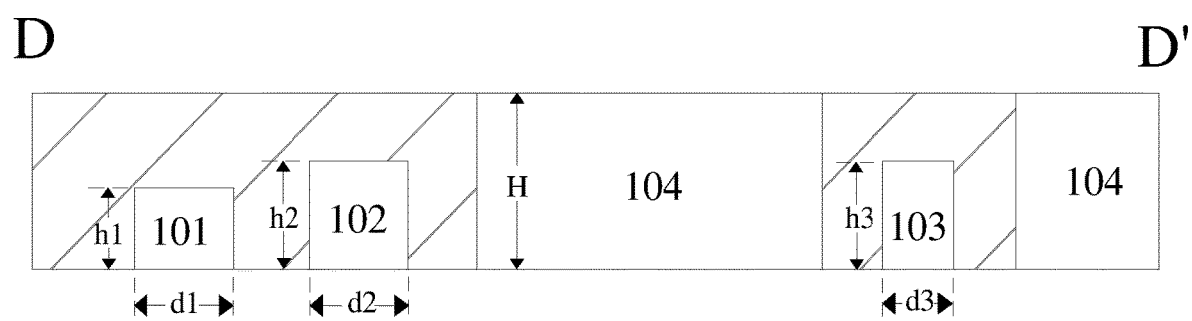
FIG. 5 is a section view of the metal mask of FIG. 3 taken along line D-D'.

FIG. 5 schematically shows a section view of the metal mask of FIG. 4 taken along line D-D'. In some embodiments of the disclosure, with reference to FIG. 5, a width d1 of the first portion of the first groove 101 in the second direction may be in a range of 6~30 mm, e.g., specifically 20 mm. With a first groove 101 having such widths, the sagging of the central area of the metal mask substantially remains unchanged, but sagging in the edge area of the mask can be decreased significantly, so that the overall sagging of the metal mask is more consistent, which in turn effectively narrows the area of the shadow of the inorganic encapsulation layer formed by using the metal mask. In another embodiment, a width of the second portion of the first groove 101 in the first direction is in a range of 6~30 mm.

In some specific examples, a width d2 of the second groove 102 in the second direction may be 6~30 mm. With a second groove 102 having the above width, sagging in the edge area of the metal mask can be further decreased, and thus sagging of the metal mask at different areas can be more uniform. In other specific examples, a width of the third groove 103 in the second direction is smaller than that of each of the first groove and the second groove in the second direction, e.g., a width d3 of the third groove 103 in the second direction can be 5~15 mm. In this way, with a third groove 103 having the above width, not only can the sagging of the edge area be further decreased, but also the sagging of the metal mask in two perpendicular directions (e.g., the first direction and the second direction) can be more uniform.

In some embodiments, a depth h1 of the first groove 101 can be 50%~60% of a thickness H of the peripheral region R, in this way, deformation of the metal mask during operation can be avoided while sagging of the edge area of the metal mask may be sufficiently decreased.

In some embodiments of the disclosure, with reference to FIG. 5, a depth h2 of the second groove 102 can be greater than the depth h1 of the first groove 101, therefore, the first groove 101 having a smaller depth can disperse more internal stress and thus further decrease sagging of the edge area of the metal mask. In some examples, a depth h3 of the third groove 103 may be the same as the depth h2 of the second groove 102. That is, the grooves on either side of the opening 104 have the same depth, thus the opening 104 is not prone to deformation.

In some embodiments, a cross-section of the first groove 101, the second groove 102 and the third groove 103 in the first direction or the second direction may have a shape of a square, an inverted trapezoid or a circle, e.g., a rectangle groove shown in FIG. 5, which can further disperse the internal stress of the metal mask and thus effectively ameliorate the sagging of the metal mask.

Figure 6:
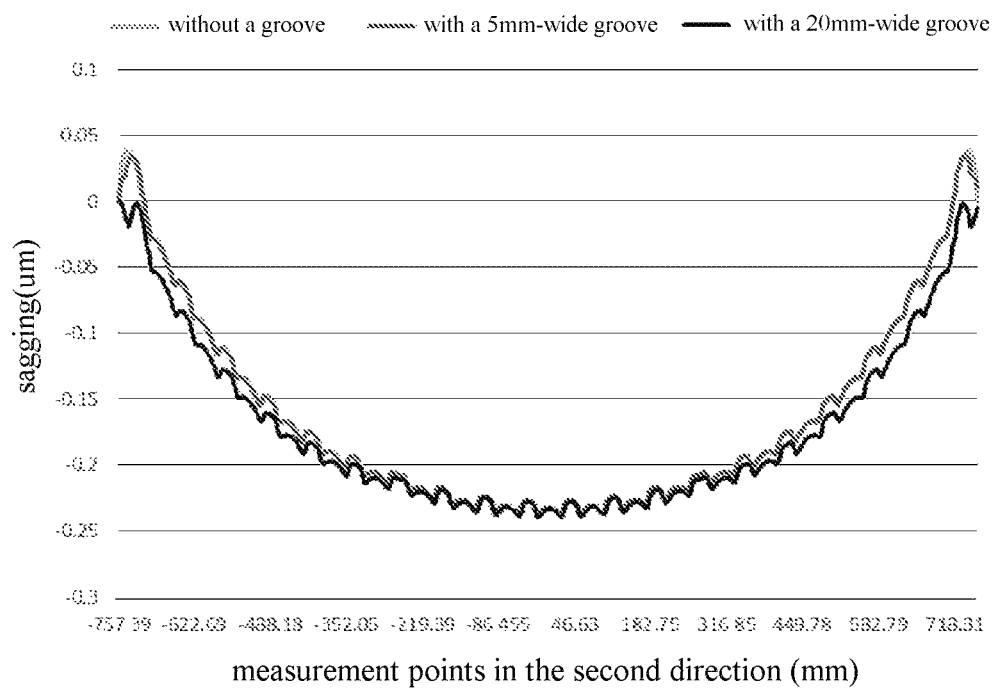
FIG. 6 illustrates comparison of sagging of different metal masks.
Figure 7:
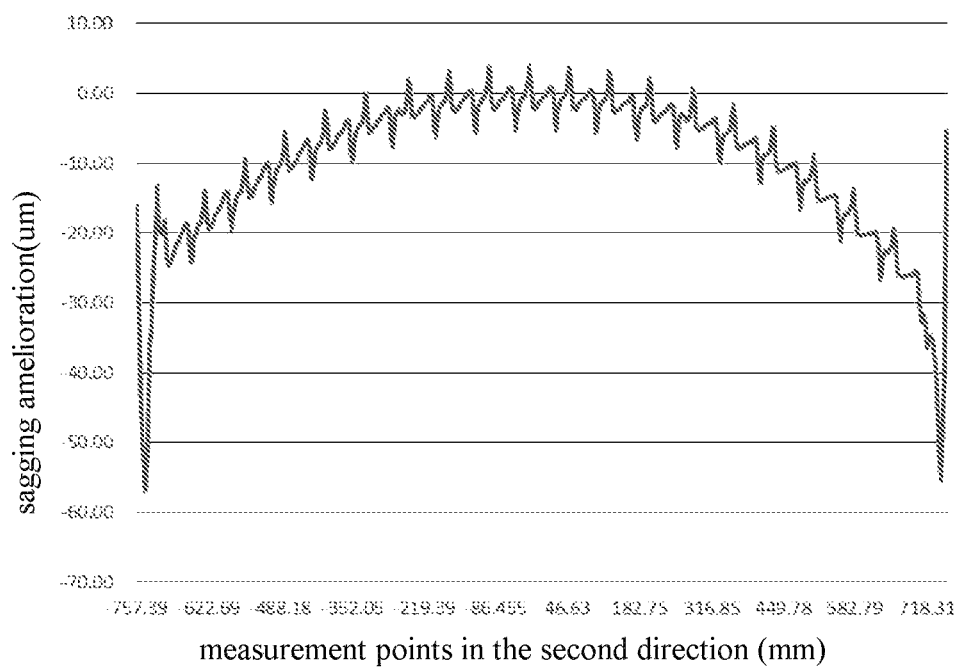
FIG. 7 illustrates sagging amelioration of the metal mask according to an embodiment of the disclosure.

FIG. 6 shows experimental comparison results regarding sagging in a certain direction of metal masks with first grooves of different sizes and a metal mask without a first groove respectively. In an example, the case where the metal mask comprises a first groove with a width of 5 mm and the case where the metal mask comprises a first groove with a width of 20 mm, are respectively compared with the case where the metal mask comprises no first groove 101, and sagging of the metal mask in the second direction in the three situations is illustrated in FIG. 6. By subjecting the sagging of the metal mask having a first groove 101 with a width of 20 mm and the sagging of the metal mask without a first groove 101 to differential treatment, an obtained amelioration in sagging is illustrated in FIG. 7. Moreover, a sagging extremum of the metal mask having a first groove 101 with a width of 20 mm is compared with that of the metal mask without a first groove 101, and the comparison result is shown in table 1 below. As can be seen from table 1 and FIGS. 6 and 7, by arranging a first groove 101 with a width of 20 mm in the peripheral region of the metal mask, sagging of the edge of the metal mask can be effectively decreased by 20~30 μm.

TABLE 1 comparison of the sagging extrema of the metal mask with and without the first groove (by micrometer)

| | | upper edge | lower edge | left edge | right edge |
|---|---|---|---|---|---|
| without the first groove | maximum sagging | 34.20 | 34.26 | 22.60 | 22.60 |
| | minimum sagging | −238.64 | −242.05 | −246.04 | −246.01 |
| with a 20 mm-wide first groove | maximum sagging | 0.00 | 0.00 | 19.03 | 19.03 |
| | minimum sagging | −239.69 | −243.09 | −247.08 | −247.04 |

To sum up, according to the embodiments of the disclosure, by arranging a first groove surrounding the opening region in the peripheral region of the metal mask, sagging of the metal mask during the fabrication of a patterned layer by using the metal mask can be decreased effectively, and tension of the metal mask can be reduced, which improves the thickness uniformity of the patterned layer (e.g., an inorganic encapsulation layer) formed by using the metal mask and thereby achieves a higher production yield of the display panel.

Another embodiment of this disclosure proposes a display panel, the display panel comprising an inorganic encapsulation layer. The inorganic encapsulation layer of the display panel is obtained by a deposition process using the above metal mask. With the metal mask provided in the above embodiments, sagging of the metal mask under gravity is effectively ameliorated during the process of fabricating the inorganic encapsulation layer, and the area of the shadow of the patterned inorganic encapsulation layer is effectively narrowed, and thus a better encapsulation effect of the display panel is achieved.

It should be noted that in addition to the above inorganic encapsulation layer, the display panel further comprises other necessary structures and components. To take an organic light-emitting diode (OLED) display panel as an example, it may further comprise a functional layers 201, barriers 202 and 203, organic encapsulation layers 205 and 206, or the like, as shown in FIG. 2, which can be designed by those skilled in the art in light of the actual function requirements of the display panel, and hence will not be detailed herein for simplicity.

To sum up, according to the embodiments herein, the disclosure proposes a display panel, of which the inorganic encapsulation layer is formed by a deposition process using a metal mask with less obvious sagging, and thus the inorganic encapsulation layer has a better thickness uniformity, which leads to a higher production yield of the display panel.

In still another aspect of this disclosure, the disclosure proposes a display device. According to an embodiment, the display device comprises the above display panel.

According to an embodiment of the disclosure, the specific type of the display device is not specially limited, and it can be any type of display device common in the art, e.g., a display screen, a cellphone, a full-color computer or a wearable device, etc., which can be correspondingly selected by those skilled in the art in light of specific usage requirements of the display device, and hence will not be detailed herein for simplicity. It should be noted that apart from the above display panel, the display device further comprises other necessary components and structures. To take an OLED display as an example, it may further comprises a cover plate, a touch panel, a power supply and a housing, which can be correspondingly added by those skilled in the art in light of usage requirements of the display device, and hence will not be detailed herein for simplicity.

In the description of this disclosure, it should be understood that orientational or positional relations indicated by terms such as "center", "longitudinal", "transversal", "length", "width", "thickness", "up", "down", "front", "back", "left", "right", "vertical", "horizontal", "top", "bottom", "internal", "external", "clockwise", "counter-clockwise", "axial", "radial" and "circumferential" are based on the drawings. They are used only for describing this disclosure and simplifying the description, rather than indicating or implying that the indicated device or element must be orientated specifically, or constructed and operated in a specific orientation, so they cannot be understood as limiting this disclosure.

In the description of the disclosure, terms such as "install", "link", "connect" and "fix" should be understood in a broad sense unless otherwise prescribed and defined explicitly. For example, "connect" may refer to a fixed connection, or detachable connection, or integrated connection; it can be mechanical connection or electrical connection; it can also be direct connection, or indirect connection via intermediate media, or connection inside two elements or interaction between two elements. For a person having ordinary skills in the art, the specific meanings of the above terms in this disclosure can be understood upon specific situations.

Besides, terms such as "first" and "second" are used only for descriptive purposes and should not be construed as indicating or implying relative importance or hinting at the number of the indicated technical features. Therefore, features defined by "first" and "second" can comprise at least one such feature explicitly or implicitly. In the description of the disclosure, "a plurality of" means at least two, e.g., two, three, and so on, unless otherwise defined explicitly.

In the depiction of this specification, description with reference to terms such as "an embodiment", "some embodiments", "example", "specific example" or "some examples" is intended to mean that specific features, structures, materials or characteristics described in combination with the embodiment or example are comprised in at least one embodiment or example of this disclosure. In this specification, schematic expressions of the above terms do not necessarily refer to the same embodiment or example. Moreover, specific features, structures, materials or characteristics described thereby can be combined in a suitable manner in any one or more embodiments or examples. Besides, where no contradiction is caused, those skilled in the art may combine different embodiments or examples, and features of different embodiments or examples described in this specification.

Although some embodiments have been shown and described in the disclosure, it can be understood that the embodiments are exemplary, and they cannot be construed as limiting the disclosure, and one having ordinary skills in the art can vary, change, substitute and modify the above embodiments without departing the scope of this disclosure.

The invention claimed is:

1. A metal mask comprising:
an opening region; and
a peripheral region,
wherein the opening region comprises a plurality of openings penetrating the metal mask,
wherein the peripheral region surrounds the opening region, and
wherein the metal mask further comprises a first groove within the peripheral region,
wherein the first groove comprises:
a first portion extending along a first edge in a first direction of the metal mask; and
a second portion extending along a second edge in a second direction of the metal mask,
wherein a distance from the first portion to the first edge in the second direction is greater than zero,
wherein a minimum distance from the second portion to the second edge in the first direction is zero, and
wherein the first direction intersects the second direction.

2. The metal mask according to claim 1, wherein a width of the first portion of the first groove in the second direction is in a range of 6 mm~30 mm.

3. The metal mask according to claim 1, wherein a width of the second portion of the first groove in the first direction is in a range of 6 mm~30 mm.

4. The metal mask according to claim 1, wherein a shape of a cross section of the first portion of the first groove in the second direction is selected from a group consisting of a square, an inverted trapezoid and a circle.

5. The metal mask according to claim 1, wherein a shape of a cross section of the second portion of the first groove in the first direction is selected from a group consisting of a square, an inverted trapezoid and a circle.

6. The metal mask according to claim 1,
wherein the metal mask further comprises a second groove in the peripheral region, and
wherein the second groove is between the first groove and the opening region.

7. The metal mask according to claim 6,
wherein the second groove extends along the first edge in the first direction of the metal mask, and
wherein the second groove and the first groove are separated from each other.

8. The metal mask according to claim 6, wherein a depth of the second groove is greater than a depth of the first groove.

9. The metal mask according to claim 6,
wherein the plurality of openings within the opening region are arranged in an array,
wherein the metal mask further comprises a third groove between two adjacent rows of openings, and
wherein the third groove extends in a same direction as the second groove.

10. The metal mask according to claim 9, wherein a width of the third groove in the second direction is smaller than a width of each of the first groove and the second groove in the second direction.

11. The metal mask according to claim 9, wherein a depth of the third groove is equal to the depth of the second groove.

12. A metal mask comprising:
an opening region; and
a peripheral region,
wherein the opening region comprises a plurality of openings penetrating the metal mask,
wherein the peripheral region surrounds the opening region,
wherein the metal mask further comprises a first groove within the peripheral region, and
wherein a depth of the first groove is 50%~60% of a thickness of the peripheral region.

13. A display panel, comprising:
an inorganic encapsulation layer obtained by a deposition process using the metal mask according to claim 1.

* * * * *